US010136207B2

(12) United States Patent
Hu et al.

(10) Patent No.: US 10,136,207 B2
(45) Date of Patent: Nov. 20, 2018

(54) PRINTED CIRCUIT BOARD USED AS VOICE COIL, METHOD FOR MANUFACTURING THE SAME AND LOUDSPEAKER WITH THE SAME

(71) Applicants: Avary Holding (Shenzhen) Co., Limited., Shenzhen (CN); HongQiSheng Precision Electronics (QinHuangDao) Co.,Ltd., Qinhuangdao (CN)

(72) Inventors: Xian-Qin Hu, Qinhuangdao (CN); Fu-Wei Zhong, Qinhuangdao (CN); Yi-Qiang Zhuang, Qinhuangdao (CN); Chun-Ming Zhou, Qinhuangdao (CN)

(73) Assignees: Avary Holding (Shenzhen) Co., Limited., Shenzhen (CN); HongQiSheng Precision Electronics (QinHuangDao) Co, Quinhuangdao (CN)

( * ) Notice: Subject to any disclaimer, the term of this patent is extended or adjusted under 35 U.S.C. 154(b) by 0 days.

(21) Appl. No.: 15/666,023

(22) Filed: Aug. 1, 2017

(65) Prior Publication Data

US 2018/0295434 A1 Oct. 11, 2018

(30) Foreign Application Priority Data

Apr. 5, 2017 (CN) .......................... 2017 1 0218180

(51) Int. Cl.

| | |
|---|---|
| ***H05K 1/02*** | (2006.01) |
| ***H04R 1/06*** | (2006.01) |
| ***H04R 31/00*** | (2006.01) |
| ***H04R 9/06*** | (2006.01) |
| ***H04R 9/02*** | (2006.01) |

(52) U.S. Cl.
CPC ............... *H04R 1/06* (2013.01); *H04R 9/025* (2013.01); *H04R 9/06* (2013.01); *H04R 31/006* (2013.01)

(58) Field of Classification Search
None
See application file for complete search history.

(56) References Cited

U.S. PATENT DOCUMENTS 9,781,825 B2 * 10/2017 Farkas ................. H05K 1/0225
9,949,360 B2 * 4/2018 Chen .................... H05K 1/0219

* cited by examiner

*Primary Examiner* — Amir Etesam
(74) *Attorney, Agent, or Firm* — ScienBiziP, P.C.

(57) ABSTRACT

A printed circuit board used as a voice coil includes N board units stacked over one another, each board unit having a first electrically connecting region and a second electrically connecting region, all of the first electrically connecting regions being stacked over one another, all of the second electrically connecting regions being stacked over one another, each board unit having a first circuit structure, a base, and a second circuit structure arranged from top to bottom, in each two adjacent board units, the first electrically connecting region of the second circuit structure of an upper board unit being electrically connected in series with the first electrically connecting region of the first circuit structure of a lower board unit, in each board unit, the first circuit structure being electrically connected in series with the second circuit structure in the second electrically connecting region.

20 Claims, 10 Drawing Sheets

PRINTED CIRCUIT BOARD USED AS VOICE COIL, METHOD FOR MANUFACTURING THE SAME AND LOUDSPEAKER WITH THE SAME

FIELD

The subject matter herein generally relates to a printed circuit board used as a voice coil, a method for manufacturing the printed circuit board, and a loudspeaker with the printed circuit board.

BACKGROUND

A conventional voice coil has a large thickness. Decreasing the thickness of a voice coil presents challenges.

BRIEF DESCRIPTION OF THE DRAWINGS

Implementations of the present technology will now be described, by way of example only, with reference to the attached figures.

DETAILED DESCRIPTION

Figure 1:
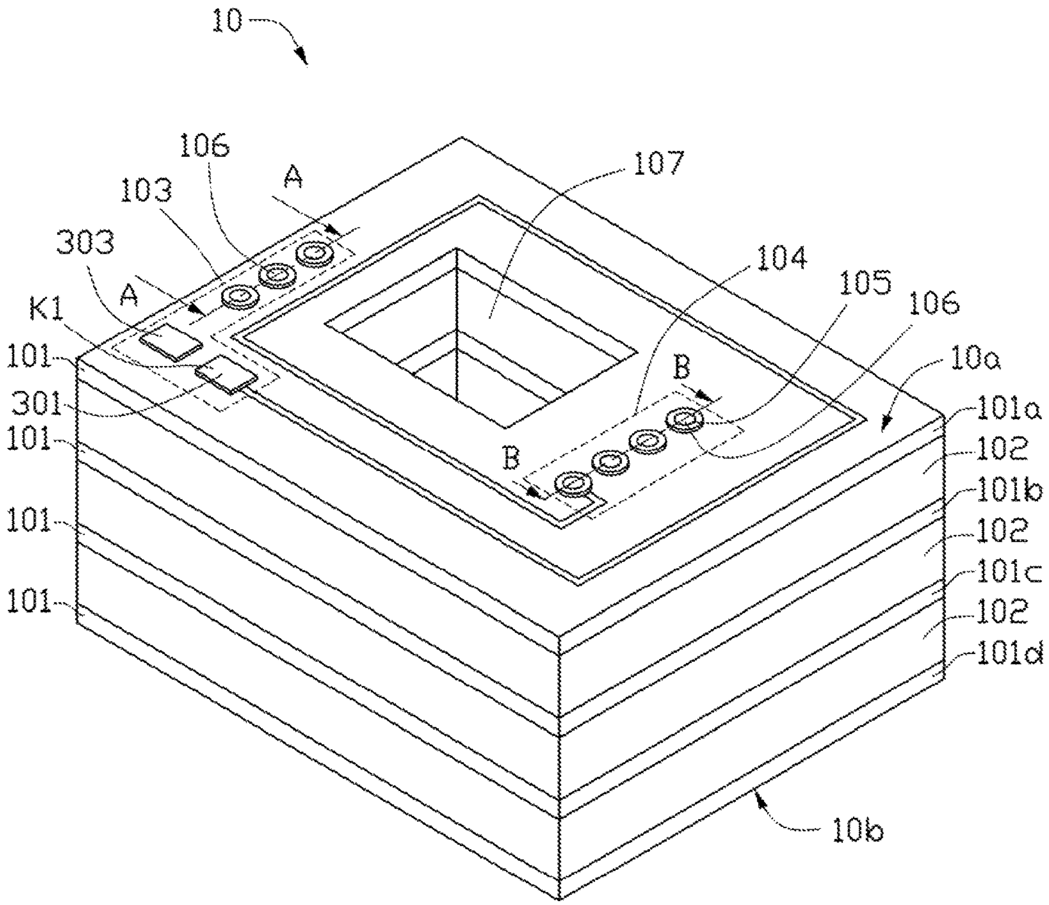
FIG. 1 is an isometric view of a printed circuit board in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series and the like.

A printed circuit board 10 used as a voice coil is disclosed. Referring to FIG. 1, the printed circuit board 10 comprises N board units 101 stacked over one another, where N□1.

In this exemplary embodiment, the printed circuit board 10 comprises four board units 101, namely, a first board unit 101*a*, a second board unit 101*b*, a third board unit 101*c*, and a fourth board unit 101*d*.

In other exemplary embodiments, the printed circuit board 10 can comprise one board unit 101, two board units 101, three board units 101, five board units 101 or ten board units 101.

An adhering layer 102 is disposed between each two adjacent board units 101. The adhering layer 102 can be made of insulating material.

The printed circuit board 10 has a top surface 10*a* and a bottom surface 10*b* opposite to the top surface 10*a*. Each board unit 101 has a first electrically connecting region 103 and a second electrically connecting region 104 (referring to FIGS. 4-11).

Figure 2:
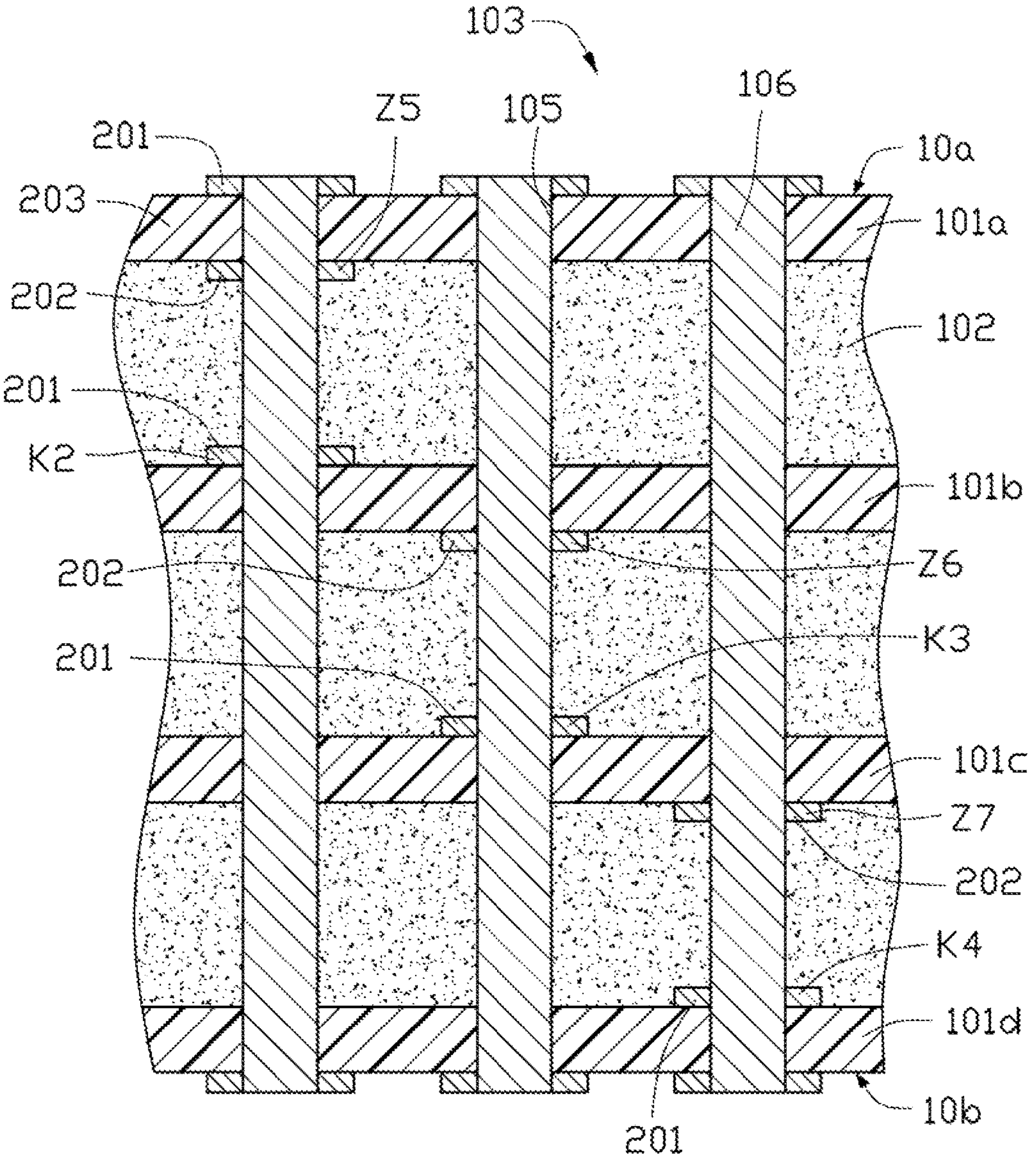
FIG. 2 is a cross section view of a part of a first electrically connecting region of the printed circuit board of FIG. 1, taken along line A-A.
Figure 3:
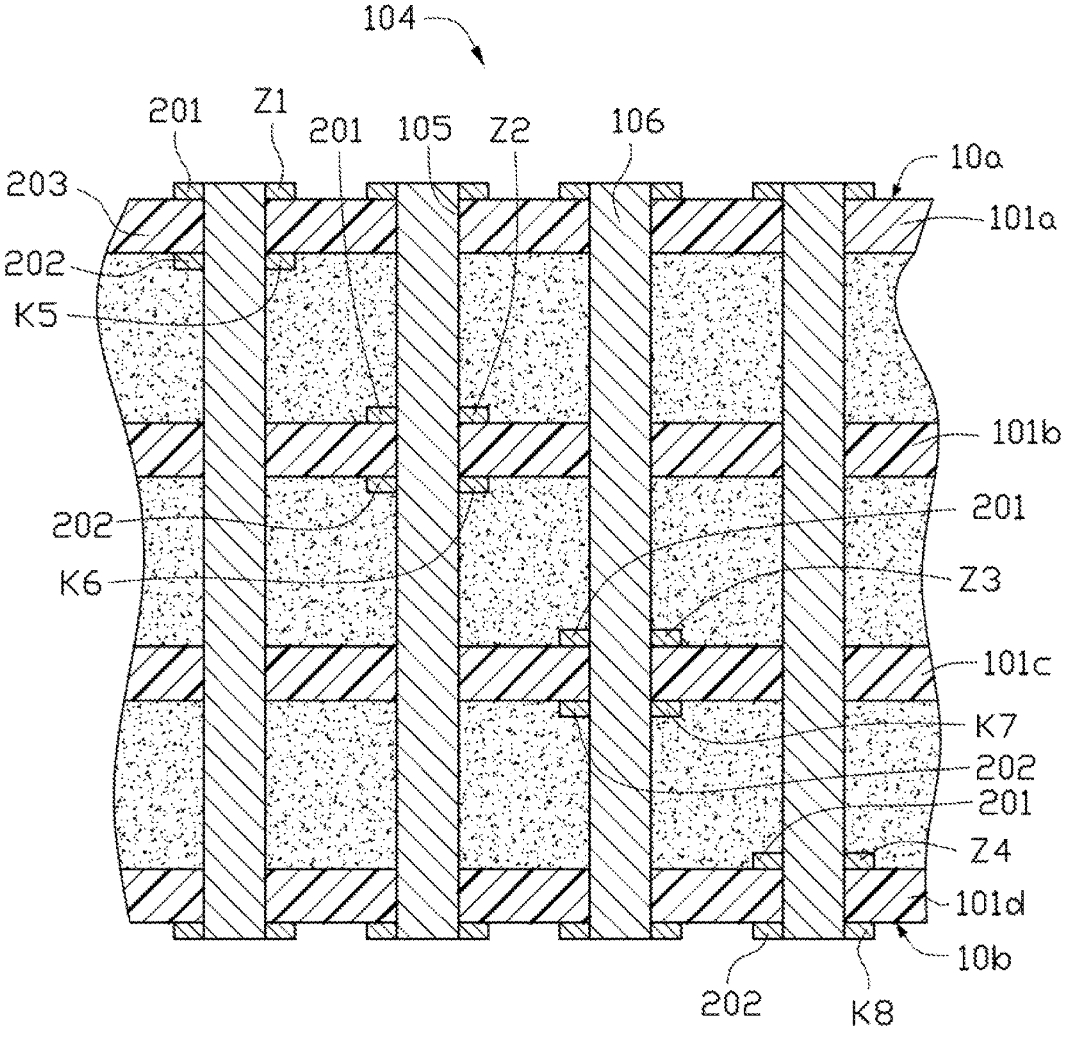
FIG. 3 is a cross section view of a second electrically connecting region of the printed circuit board of FIG. 1, taken along line B-B.

Referring to FIGS. 2-3, all of the first electrically connecting regions 103 are stacked over one another. All of the second electrically connecting regions 104 are stacked over one another.

Each board unit 101 has a first circuit structure 201, a base 203, and a second circuit structure 202. The first circuit structure 201, the base 203, and the second circuit structure

202 are arranged from top to bottom. The first circuit structure 201 is on a top surface of the base 203, while the second circuit structure 202 is on a bottom surface of the base 203. The first circuit structure 201 and the second circuit structure 202 can be made of copper.

Starting points K1, K2, K3, and K4 in the first electrically connecting regions 103 of the first circuit structures 201 of the board units 101 are staggered, and starting points K5, K6, K7, and K8 in the second electrically connecting regions 104 of the second circuit structures 202 of the board units 101 are staggered.

Ending points Z1, Z2, Z3, and Z4 in the second electrically connecting regions 104 of the first circuit structures 201 of the board units 101 are staggered, and ending points Z5, Z6, Z7, and Z8 in the first electrically connecting regions 103 of the second circuit structures 202 of the board units 101 are staggered.

Further, referring to FIGS. 1-3, a plurality of holes 105 can be defined as through holes extending from the top surface 10*a* to the bottom surface 10*b* of the printed circuit board 10. Each hole 105 receives an electrically connecting portion 106.

The number of the board units is N, the number of the holes is 2N−1. For example, the total number of holes 105 is equal to two times the total number of board units 101 minus one (i.e., 2N−1). N−1 holes are positioned in the first electrically connecting regions 103, and N holes are positioned in the second electrically connecting regions 104.

Referring to FIG. 2, in each two adjacent board units 101, the first electrically connecting region 103 of the second circuit structure 202 of an upper board unit 101 is electrically connected in series with the first electrically connecting region 103 of the first circuit structure 201 of a lower board unit 101 by one or more of the electrically connecting portions 106 received in one or more of the holes 105.

In FIG. 2, the ending point Z5 is electrically connected to the starting point K2 by an electrically connecting portion 106 received in a hole 105; the ending point Z6 is electrically connected to the starting point K3 by another electrically connecting portion 106 received in another hole 105; the ending point Z7 is electrically connected to the starting point K4 by yet another electrically connecting portion 106 received in yet another hole 105.

Referring to FIG. 3, in each board unit 101, the first circuit structure 201 is electrically connected in series with the second circuit structure 202 in the second electrically connecting region 104 by one or more of the electrically connecting portions 106 received in one or more of the holes 105.

In at least one exemplary embodiments, the ending point Z1 is electrically connected to the starting point K5 by an electrically connecting portion 106 received in a hole 105; the ending point Z2 is electrically connected to the starting point K6 by another electrically connecting portion 106 received in another hole 105; the ending point Z3 is electrically connected to the starting point K7 by another electrically connecting portion 106 received in another hole 105; the ending point Z4 is electrically connected to the starting point K8 by yet another electrically connecting portion 106 received in yet another hole 105.

Referring to FIGS. 4-11, each first circuit structure 201 starts in the first electrically connecting region 103, spirals around and closes to the second electrically connecting region 104, and ends in the second electrically connecting region 104. Each second circuit structure 202 starts in the second electrically connecting region 104, spirals around and away from the second electrically connecting region 104, and ends in the first electrically connecting region 103.

Each first circuit structure 201 and second circuit structure 202 spirals around the second electrically connecting region 104 along a clockwise direction or a counterclockwise direction.

Figure 11:
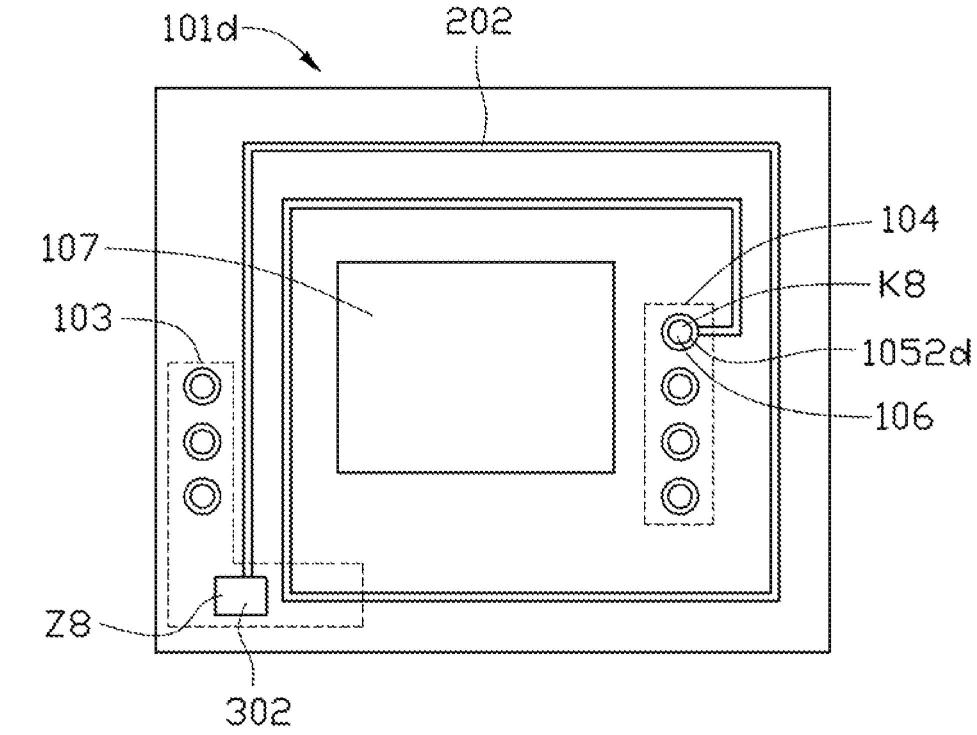
FIG. 11 is a top view of a second circuit structure on a bottom surface of a fourth board unit of the printed circuit board FIG. 1 in accordance with an exemplary embodiment of the present disclosure.

Referring to FIG. 1, the first electrically connecting region 103 of the first circuit structure 201 of the board unit 101 has a starting terminal 301 positioned at the starting point K1. Referring to FIG. 11, the first electrically connecting region 103 of the second circuit structure 202 of the Nth board unit 101 has an ending terminal 302 positioned at the ending point Z8.

Figure 4:
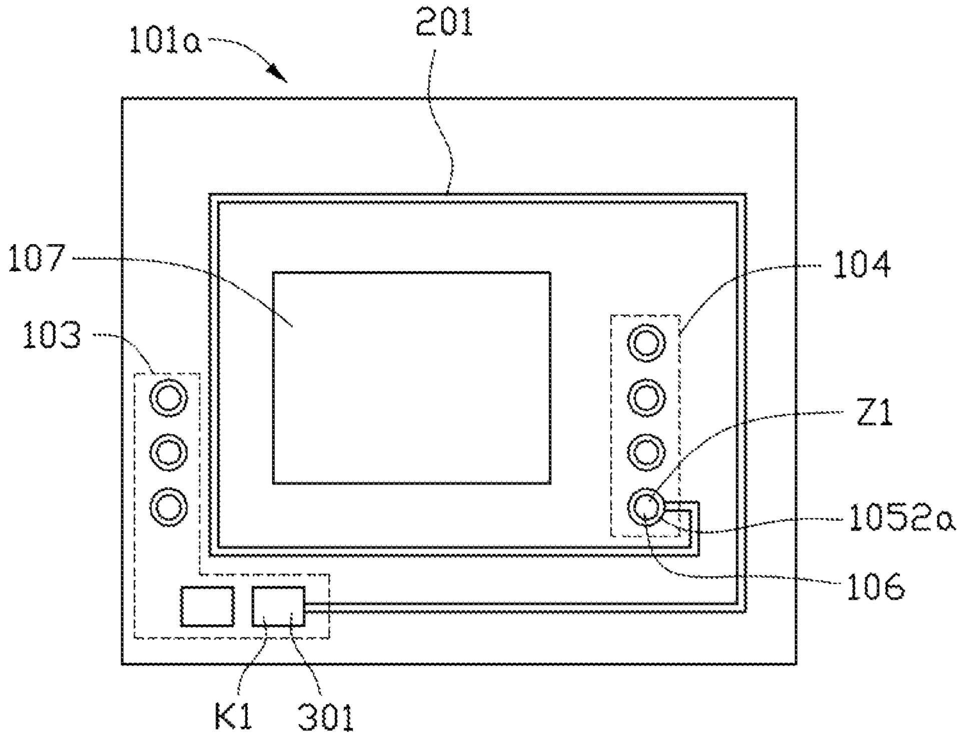
FIG. 4 is a top view of a first circuit structure on a top surface of a first board unit of the printed circuit board of FIG. 1 in accordance with an exemplary embodiment of the present disclosure.
Figure 5:
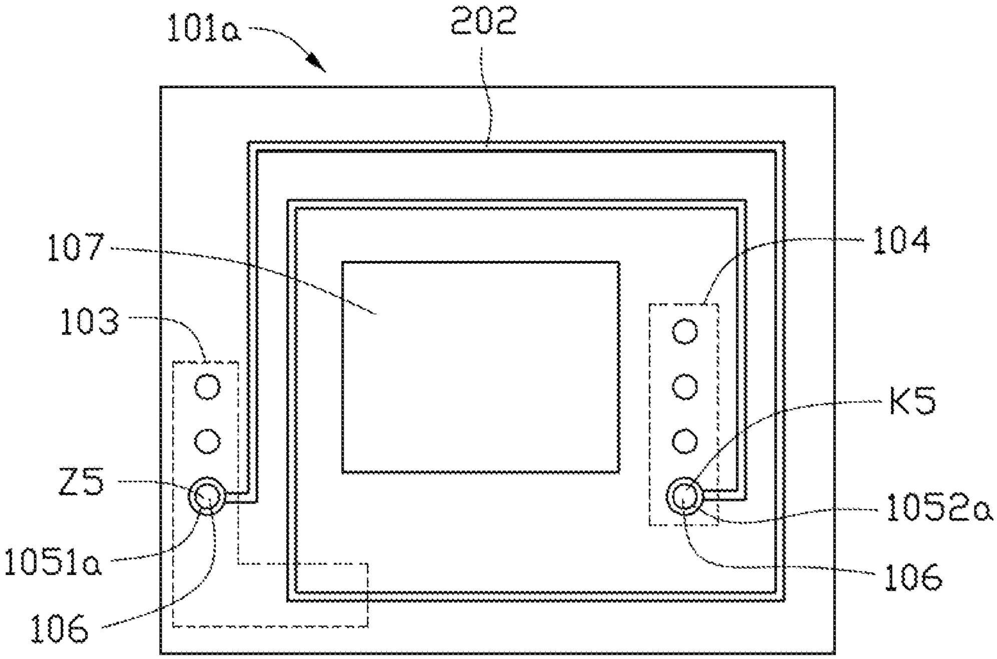
FIG. 5 is a top view of a second circuit structure on a bottom surface of a first board unit of the printed circuit board of FIG. 1 in accordance with an exemplary embodiment of the present disclosure.

In this exemplary embodiment, referring to FIGS. 1 and 4-11, in the first board unit 101*a* (as shown in FIGS. 4 and 5):

the first circuit structure 201 starts in the starting terminal 301 of the first electrically connecting region 103 positioned at the starting point K1, spirals around and closes to the second electrically connecting region 104 along a counterclockwise direction, and ends in the electrically connecting portion 106 of a first hole 1052*a* of the second electrically connecting region 104 positioned at the ending point Z1;

the second circuit structure 202 starts in the electrically connecting portion 106 of the first hole 1052*a* of the second electrically connecting region 104 positioned at the starting point K5, spirals around and away from the second electrically connecting region 104 along a counterclockwise direction, and ends in the electrically connecting portion 106 of a first hole 1051*a* of the first electrically connecting region 103 position at the ending point Z5.

Figure 6:
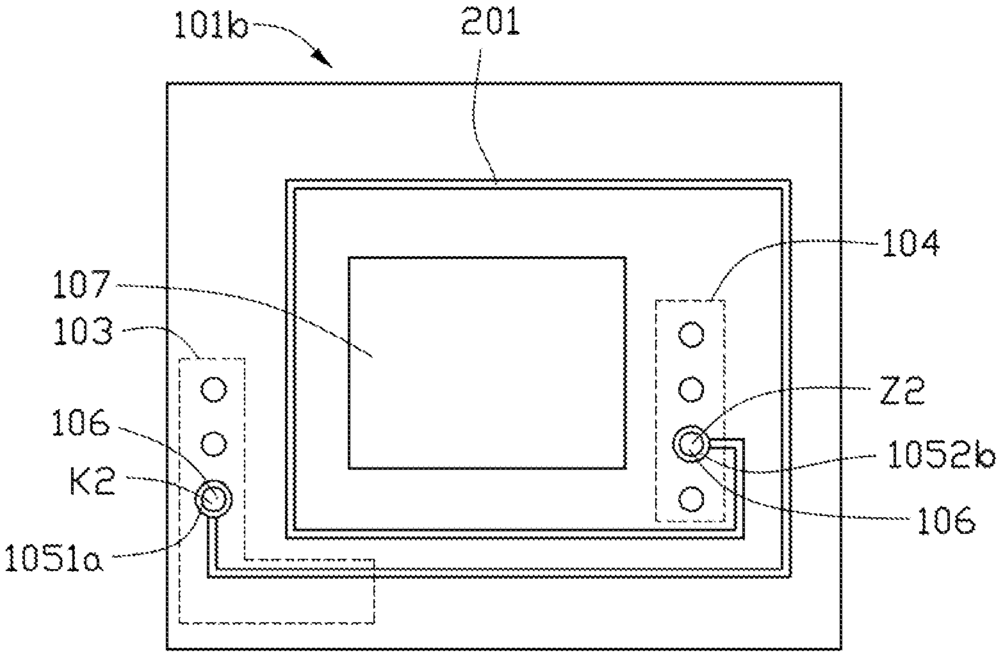
FIG. 6 is a top view of a first circuit structure on a top surface of a second board unit of the printed circuit board of FIG. 1 in accordance with an exemplary embodiment of the present disclosure.
Figure 7:
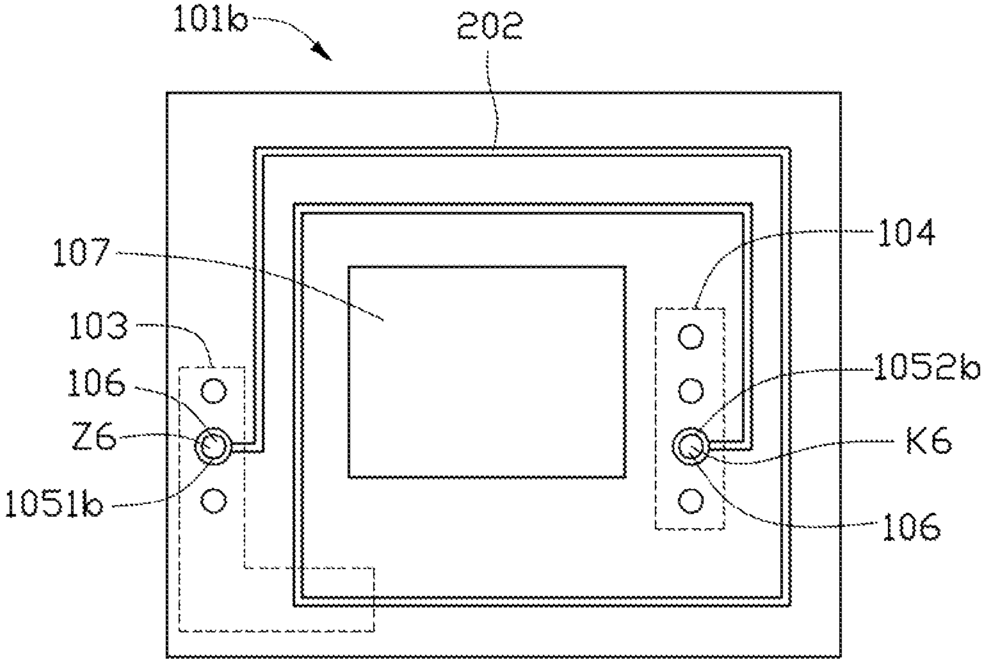
FIG. 7 is a top view of a second circuit structure on a bottom surface of a second board unit of the printed circuit board FIG. 1 in accordance with an exemplary embodiment of the present disclosure.

In the second board unit 101*b* (as shown in FIGS. 6 and 7):

the first circuit structure 201 starts in the first hole 1051*a* of the first electrically connecting region 103 positioned at the starting point K2, spirals around and closes to the second electrically connecting region 104 along a counterclockwise direction, and ends in the electrically connecting portion 106 of a second hole 1052*b* of the second electrically connecting region 104 positioned at the ending point Z2;

the second circuit structure 202 starts in the electrically connecting portion 106 of the second hole 1052*b* of the second electrically connecting region 104 positioned at the starting point K6, spirals around and away from the second electrically connecting region 104 along a counterclockwise direction, and ends in the electrically connecting portion 106 of a second hole 1051*b* of the first electrically connecting region 103 position at the ending point Z6.

Figure 8:
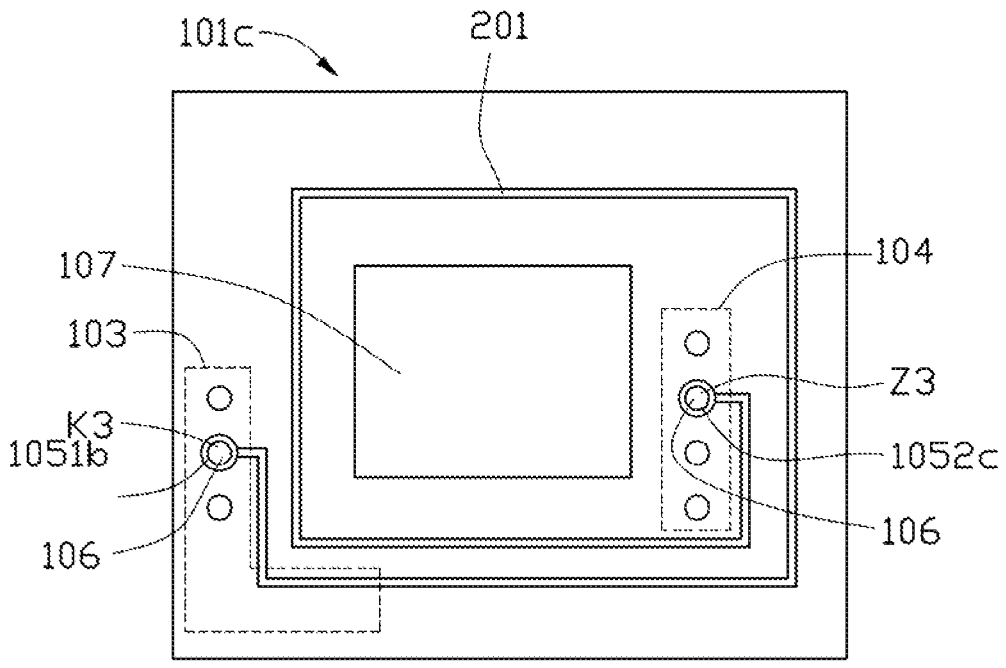
FIG. 8 is a top view of a first circuit structure on a top surface of a third board unit of the printed circuit board FIG. 1 in accordance with an exemplary embodiment of the present disclosure.
Figure 9:
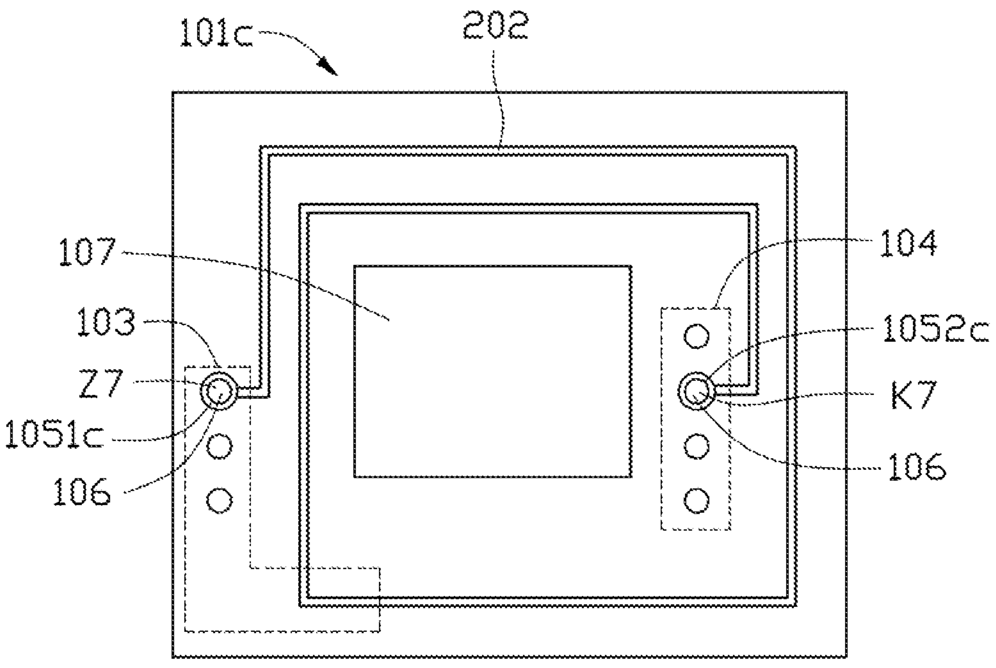
FIG. 9 is a top view of a second circuit structure on a bottom surface of a third board unit of the printed circuit board FIG. 1 in accordance with an exemplary embodiment of the present disclosure.

In the third board unit 101*c* (as shown in FIGS. 8 and 9):

the first circuit structure 201 starts in the second hole 1051*b* of the first electrically connecting region 103 positioned at the starting point K3, spirals around and closes to the second electrically connecting region 104 along a counterclockwise direction, and ends in the electrically connecting portion 106 of a third hole 1052*c* of the second electrically connecting region 104 positioned at the ending point Z3;

the second circuit structure 202 starts in the electrically connecting portion 106 of the third hole 1052*c* of the second electrically connecting region 104 positioned at the starting point K7, spirals around and away from the second electrically connecting region 104 along a counterclockwise direction, and ends in the electrically connecting portion 106 of a third hole 1051*c* of the first electrically connecting region 103 position at the ending point Z7.

Figure 10:
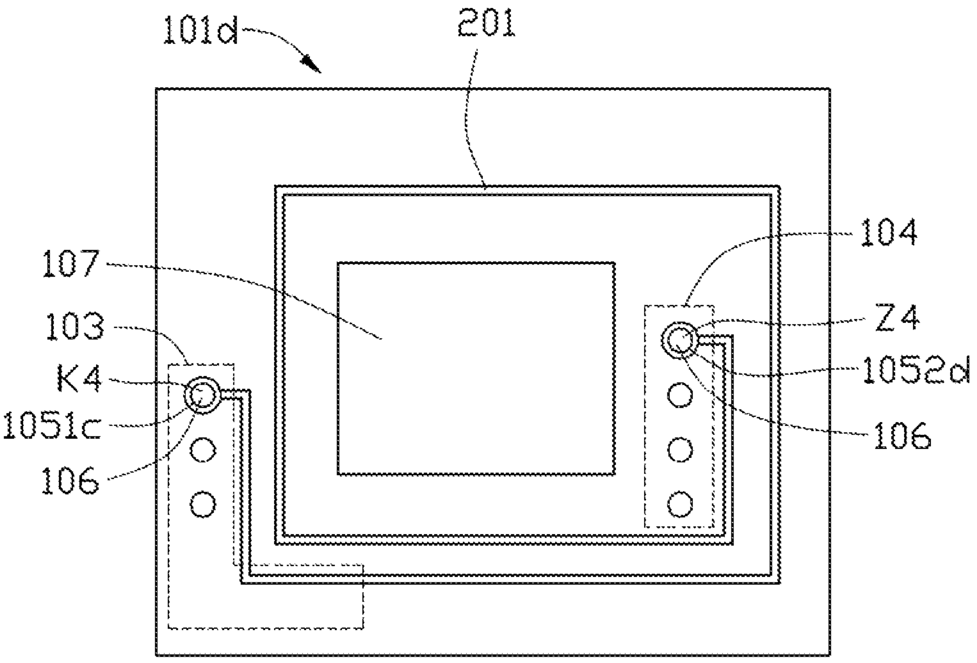
FIG. 10 is a top view of a first circuit structure on a top surface of a fourth board unit of the printed circuit board FIG. 1 in accordance with an exemplary embodiment of the present disclosure.

In the fourth board unit 101*d* (as shown in FIGS. 10 and 11):

the first circuit structure 201 starts in the third hole 1051*c* of the first electrically connecting region 103 positioned at the starting point K4, spirals around and closes to the second electrically connecting region 104 along a counterclockwise direction, and ends in the electrically connecting portion 106 of a fifth hole 1052*d* of the second electrically connecting region 104 positioned at the ending point Z4;

the second circuit structure 202 starts in the electrically connecting portion 106 of the fifth hole 1052*d* of the second electrically connecting region 104 positioned at the starting point K8, spirals around and away from the second electrically connecting region 104 along a counterclockwise direction, and ends in the ending terminal 302 of the first electrically connecting region 103 position at the ending point Z8.

Further, a plurality of pads 108 can be formed around the holes 105 of the printed circuit board 10.

The printed circuit board 10 has an extending terminal 303 and an electrically connecting hole (not shown). The extending terminal 303 can be formed on the top surface 10*a* of the printed circuit board 10 and positioned at the first electrically connecting region 103. The electrically connecting hole is defined through the top surface 10*a* and the bottom surface 10*b* of the printed circuit board 10 and is electrically connecting between the ending terminal 302 and the extending terminal 303.

The printed circuit board 10 also has a receiving channel 107 formed through the top surface 10*a* and the bottom surface 10*b* of the printed circuit board 10.

Each first circuit structure 201 starts in the first electrically connecting region 103, spirals around and closes to the second electrically connecting region 104 and the receiving channel 107, and ends in the second electrically connecting region 104. Each second circuit structure 202 starts in the second electrically connecting region 104, spirals around and away from the second electrically connecting region 104 and the receiving channel 107, and ends in the first electrically connecting region 103.

In at least one exemplary embodiment, referring to FIGS. 1-11, the first electrically connecting regions 103 and the second electrically connecting regions 104 are positioned on opposite sides of the receiving channel 107.

Figure 12:
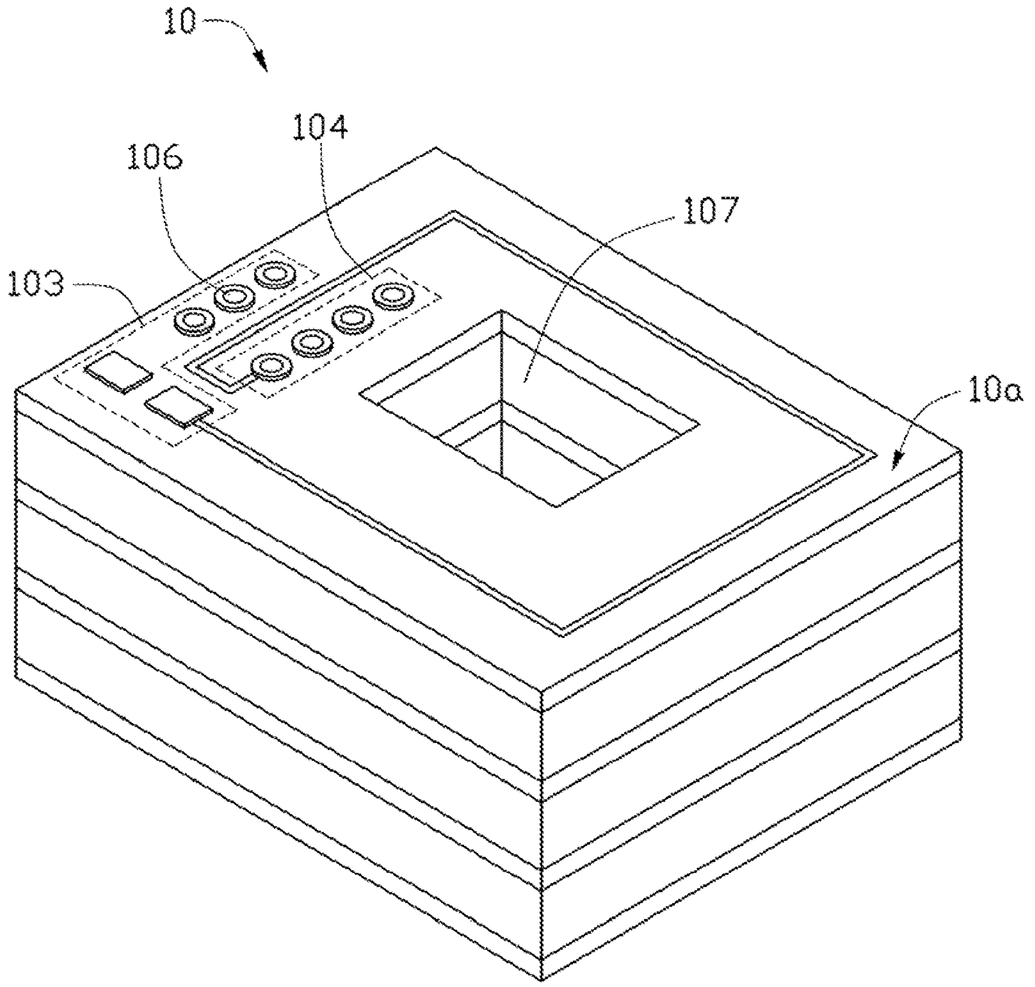
FIG. 12 is an isometric view of a printed circuit board in accordance with another exemplary embodiment of the present disclosure.

In another exemplary embodiment, referring to FIG. 12, the first electrically connecting regions 103 and the second electrically connecting regions 104 are positioned on one side of the receiving channel 107.

A method for manufacturing a printed circuit board 10 comprises:

providing N board units 101, where N≥1, each board unit 101 having a first electrically connecting region 103 and a second electrically connecting region 104, each board unit 101 having a first circuit structure 201, a base 203, and a second circuit structure 202 arranged from top to bottom, each first circuit structure 201 starting in the first electrically connecting region 103, spiraling around and closing to the second electrically connecting region 104, and ending in the first electrically connecting region 103, each second circuit structure 202 starting in the second electrically connecting region 104, spiraling around and away from the second electrically connecting region 104, and ending in the first electrically connecting region 103;

stacking the N board units 101, the first electrically connecting regions 103 being stacked over one another, and the second electrically connecting regions 104 being stacked over one another;

starting points K1, K2, K3, and K4 in the first electrically connecting regions 103 of the first circuit structures 201 of the board units 101 being staggered, and starting points K5, K6, K7, and K8 in the second electrically connecting regions 104 of the second circuit structures 202 of the board units 101 being staggered, ending points Z1, Z2, Z3, and Z4 in the second electrically connecting regions 104 of the first circuit structures 201 of the board units 101 being staggered, and ending points Z5, Z6, Z7, and Z8 in the first electrically connecting regions 103 of the second circuit structures 202 of the board units 101 being staggered; and in each board unit 101, electrically connecting in series the first structure 201 and the second circuit structure 202 in the second electrically connecting region 104, in each two adjacent board unit 101, electrically connecting in series the first electrically connecting region 103 of the second circuit structure 202 of an upper board unit 101 and the first electrically connecting region 103 of the first circuit structure 201 of a lower board unit 101.

In the "providing N board units 101, where N≥1, each board unit 101 having a first electrically connecting region 103 and a second electrically connecting region 104, each board unit 101 having a first circuit structure 201, a base 203, and a second circuit structure 202 arranged from top to bottom, each first circuit structure 201 starting in the first electrically connecting region 103, spiraling around and closing to the second electrically connecting region 104, and ending in the first electrically connecting region 103, each second circuit structure 202 starting in the second electrically connecting region 104, spiraling around and away from the second electrically connecting region 104, and ending in the first electrically connecting region 103", the first circuit structures 201 and the second circuit structures 202 can be made of copper.

In this exemplary embodiment, referring to FIGS. 4-11, each first circuit structure 201 starts in the first electrically connecting region 103, spirals around and closes to the second electrically connecting region 104 along a counterclockwise direction, and ends in the second electrically connecting region 104. Each second circuit structure 202 starts in the second electrically connecting region 104, spirals around and away from the second electrically connecting region 104 along a counterclockwise direction, and ends in the first electrically connecting region 103. In other exemplary embodiments (not shown), each first circuit structure 201 can start in the first electrically connecting region 103, spiral around and close to the second electrically connecting region 104 along a clockwise direction, and end in the second electrically connecting region 104. Each second circuit structure 202 can start in the second electrically connecting region 104, spiral around and keep away from the second electrically connecting region 104 along a clockwise direction, and end in the first electrically connecting region 103.

In the "stacking the N board units 101, the first electrically connecting regions 103 being stacked over one another, and the second electrically connecting regions 104 being stacked over one another", an adhering layer 102 can be disposed between each two adjacent board units 101. The adhering layer 102 can be made of insulating material.

The N board units 101 can be four board units 101.

Referring to FIGS. 13-16, for illustration purposes, in the first board unit 101*a*, a plane in which the first circuit structure 201 is located is marked as a first surface L1, a plane in which the second circuit structure 202 is located is marked as a second surface L2, and the first surface L1 is opposite to the second surface L2. In the second board unit 101*b*, a plane in which the first circuit structure 201 is located is marked as a third surface L3, a plane in which the second circuit structure 202 is located is marked as a fourth surface L4, and the third surface L3 is opposite to the fourth surface L4. In the third board unit 101*c*, a plane in which the first circuit structure 201 is located is marked as a fifth surface L5, a plane in which the second circuit structure 202 is located is marked as a sixth surface L6, and the fifth surface L5 is opposite to the sixth surface L6. In the fourth board unit 101*d*, a plane in which the first circuit structure 201 is located is marked as a seventh surface L7, a plane in which the second circuit structure 202 is located is marked as an eighth surface L8, and the seventh surface L7 is opposite to the eighth surface L8.

A first exemplary embodiment of "stacking the N board unit 101" is as follows.

Figure 13:
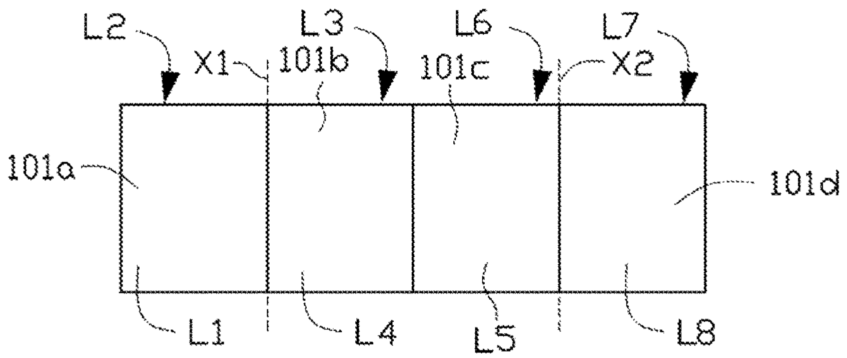
FIG. 13 is a diagram of a first step of a first exemplary embodiment of "stacking N board units" on the printed circuit board of FIG. 1.
Figure 14:
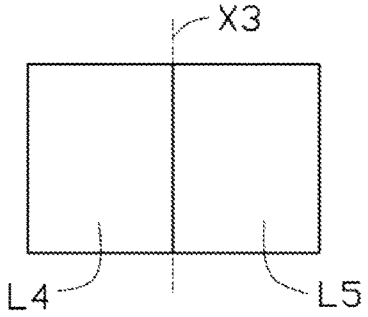
FIG. 14 is a diagram of a second step of the first exemplary embodiment of "stacking N board units" on the printed circuit board of FIG. 1.

Referring to FIG. 13, the first surface L1, the fourth surface L4, the fifth surface L5 and the eighth surface L8 are arranged from left to right and face upward. The first surface L1 and the eighth surface L8 are respectively folded backwardly along a first folding line X1 and a third folding line X2. The second surface L2 faces the third surface L3, and the sixth surface L6 faces the seventh surface L7. Then, referring to FIG. 14, the fourth surface L4 and fifth surface L5 are arranged from left to right and face upward. The fourth surface L4 and the fifth surface L5 are folded backwardly along a second folding line X3, and the fourth surface L4 faces the fifth surface L5.

A second exemplary embodiment of "stacking the N board unit 101" is as follows.

Figure 15:
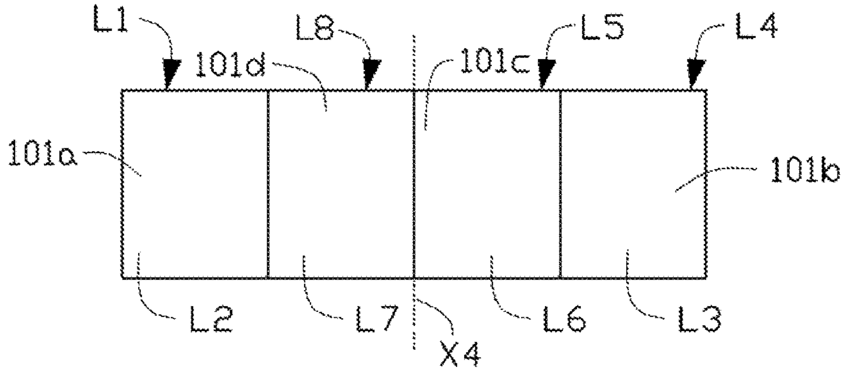
FIG. 15 is a diagram of a first step of a second exemplary embodiment of "stacking N board units" on the printed circuit board of FIG. 1.
Figure 16:
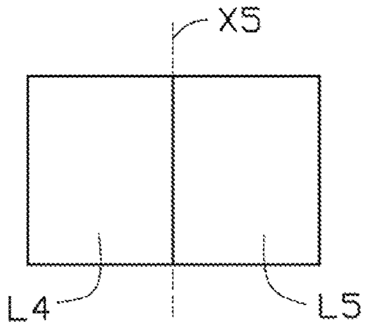
FIG. 16 is a diagram of a second step of the second exemplary embodiment of "stacking N board units" on the printed circuit board of FIG. 1.

Referring to FIG. 15, the second surface L2, the seventh surface L7, the sixth surface L6 and the third surface L3 are arranged from left to right and face upward. The seventh surface L7 and the sixth surface L6 are folded forwardly along a fourth folding line X4. The second surface L2 faces the third surface L3, and the sixth surface L6 faces the seventh surface L7. Then, referring to FIG. 16, the fourth surface L4 and fifth surface L5 are arranged from left to right and face upward. The fourth surface L4 and the fifth surface L5 are folded backwardly along a fifth folding line X5, and the fourth surface L4 faces the fifth surface L5.

Further, a plurality of adhering layers 102 can be adhered between the second surface L2 and the third surface L3, between the fourth surface L4 and the fifth surface L5, and between the sixth surface L6 and the seventh surface L7.

In the "starting points K1, K2, K3, and K4 in the first electrically connecting regions 103 of the first circuit structures 201 of the board units 101 being staggered, and starting points K5, K6, K7, and K8 in the second electrically connecting regions 104 of the second circuit structures 202 of the board units 101 being staggered, ending points Z1, Z2, Z3, and Z4 in the second electrically connecting regions 104 of the first circuit structures 201 of the board units 101 being staggered, and ending points Z5, Z6, Z7, and Z8 in the first electrically connecting regions 103 of the second circuit structures 202 of the board units 101 being staggered", referring to FIGS. 1 and 4, the first circuit structure 201 of the first board unit 101*a* starts in the starting point K1. Referring to FIGS. 2 and 6, the first circuit structure 201 of the second board unit 101*b* starts in the starting point K2. Referring to FIGS. 2 and 8, the first circuit structure 201 of the third board unit 101*c* starts in starting point K3. Referring to FIGS. 2 and 10, the first circuit structure 201 of the fourth board unit 101*d* starts in starting point K4. Referring to FIGS. 3 and 5, the second circuit structure 202 of the first board unit 101*a* starts in starting point K5. Referring to FIGS. 3 and 7, the second circuit structure 202 of the second board unit 101*b* starts in starting point K6. Referring to FIGS. 3 and 9, the second circuit structure 202 of the third board unit 101*c* starts in starting point K7. Referring to FIGS. 3 and 11, the second circuit structure 202 of the fourth board unit 101*d* starts in starting point K8.

Referring to FIGS. 3 and 4, the first circuit structure 201 of the first board unit 101*a* ends in the ending point Z1. Referring to FIGS. 3 and 6, the first circuit structure 201 of the second board unit 101*b* ends in the ending point Z2. Referring to FIGS. 3 and 8, the first circuit structure 201 of the third board unit 101*c* ends in the ending point Z3. Referring to FIGS. 3 and 10, the first circuit structure 201 of the fourth board unit 101*d* ends in the ending point Z4. Referring to FIGS. 2 and 5, the second circuit structure 202 of the first board unit 101*a* ends in the ending point Z5. Referring to FIGS. 2 and 7, the second circuit structure 202 of the second board unit 101*b* ends in the ending point Z6. Referring to FIGS. 2 and 9, the second circuit structure 202 of the third board unit 101*c* ends in the ending point Z7. Referring to FIGS. 2 and 11, the second circuit structure 202 of the fourth board unit 101*d* ends in the ending point Z8.

Referring to FIG. 1, the first electrically connecting region 103 of the first circuit structure 201 of the board unit 101 can have a starting terminal 301 positioned at starting point K1. Referring to FIG. 11, the first electrically connecting region 103 of the second circuit structure 202 of the Nth board unit 101 can have an ending terminal 302 positioned at ending point Z8.

In the "in each board unit 101, electrically connecting in series the first circuit structure 201 and the second circuit structure 202 in the second electrically connecting region 104, in each two adjacent board unit 101, electrically connecting in series the first electrically connecting region 103 of the second circuit structure 202 of an upper board unit 101 and the first electrically connecting region 103 of the first circuit structure 201 of a lower board unit 101", a plurality of holes 105 can be defined through the top surface 10*a* and the bottom surface 10*b* of the printed circuit board 10. Each hole 105 receives an electrically connecting portion 106. The electrically connecting portions 106 can be received in the holes 105 by electroplating. The electrically connecting portions 106 can be made of copper.

The number of the board units is N, the number of the holes is 2N−1. For example, the total number of holes 105 is equal to two times the total number of board units 101 minus one (i.e., 2N−1). N−1 holes are positioned in the first electrically connecting regions 103, and N holes are positioned in the second electrically connecting regions 104.

Referring to FIG. 2, the ending points Z5 is electrically connected to the starting points K2 by the electrically connecting portion received in the hole 105; the ending points Z6 is electrically connected to the starting points K3 by the electrically connecting portion received in the hole 105; the ending points Z7 is electrically connected to the starting points K4 by the electrically connecting portion received in the hole 105.

Referring to FIG. 3, the ending point Z1 is electrically connected to the starting point K5 by the electrically connecting portion received in the hole 105; the ending point Z2 is electrically connected to the starting point K6 by the electrically connecting portion received in the hole 105; the ending point Z3 is electrically connected to the starting point K7 by the electrically connecting portion received in the hole 105; the ending point Z4 is electrically connected to the starting point K8 by the electrically connecting portion received in the hole 105.

In this exemplary embodiment, referring to FIGS. 1 and 4-11, the printed circuit board 10 comprises four board units 101. The four board units 101 respectively are a first board unit 101*a,* a second board unit 101*b,* a third board unit 101*c,* and a fourth board unit 101*d.*

In the first board unit 101*a,* the first circuit structure 201 starts in the starting terminal 301 of the first electrically connecting region 103 positioned at the starting point K1, spirals around and closes to the second electrically connecting region 104 along a counterclockwise direction, and ends in the electrically connecting portion 106 of a first hole 1052*a* of the second electrically connecting region 104 positioned at the ending point Z1. The second circuit structure 202 starts in the electrically connecting portion 106 of the first hole 1052*a* of the second electrically connecting region 104 positioned at the starting point K5, spirals around and away from the second electrically connecting region 104 along a counterclockwise direction, and ends in the electrically connecting portion 106 of a first hole 1051*a* of the first electrically connecting region 103 position at the ending point Z5.

In the second board unit 101*b,* the first circuit structure 201 starts in the first hole 1051*a* of the first electrically connecting region 103 positioned at the starting point K2, spirals around and closes to the second electrically connecting region 104 along a counterclockwise direction, and ends in the electrically connecting portion 106 of a second hole 1052*b* of the second electrically connecting region 104 positioned at the ending point Z2. The second circuit structure 202 starts in the electrically connecting portion 106 of the second hole 1052*b* of the second electrically connecting region 104 positioned at the starting point K6, spirals around and away from the second electrically connecting region 104 along a counterclockwise direction, and ends in the electrically connecting portion 106 of a second hole 1051*b* of the first electrically connecting region 103 position at the ending point Z6.

In the third board unit 101*c,* the first circuit structure 201 starts in the second hole 1051*b* of the first electrically connecting region 103 positioned at the starting point K3, spirals around and closes to the second electrically connecting region 104 along a counterclockwise direction, and ends in the electrically connecting portion 106 of a third hole 1052*c* of the second electrically connecting region 104 positioned at the ending point Z3. The second circuit structure 202 starts in the electrically connecting portion 106 of the third hole 1052*c* of the second electrically connecting region 104 positioned at the starting point K7, spirals around and away from the second electrically connecting region 104 along a counterclockwise direction, and ends in the electrically connecting portion 106 of a third hole 1051*c* of the first electrically connecting region 103 positioned at the ending point Z7.

In the fourth board unit 101*d,* the first circuit structure 201 starts in the third hole 1051*c* of the first electrically connecting region 103 positioned at the starting point K4, spirals around and closes to the second electrically connecting region 104 along a counterclockwise direction, and ends in the electrically connecting portion 106 of a fifth hole 1052*d* of the second electrically connecting region 104 positioned at the ending point Z4. The second circuit structure 202 starts in the electrically connecting portion 106 of the fifth hole 1052*d* of the second electrically connecting region 104 positioned at the starting point K8, spirals around and away from the second electrically connecting region 104 along a counterclockwise direction, and ends in the ending terminal 302 of the first electrically connecting region 103 positioned at the ending point Z8.

The method for manufacturing the printed circuit board 10 can further comprise: forming a receiving channel 107 through the top surface 10*a* and bottom surface 10*b* of the printed circuit board 10.

Each first circuit structure 201 starts in the first electrically connecting region 103, spirals around and closes to the second electrically connecting region 104 and the receiving channel 107, and ends in the second electrically connecting region 104. Each second circuit structure 202 starts in the second electrically connecting region 104, spirals around and away from the second electrically connecting region 104 and the receiving channel 107, and ends in the first electrically connecting region 103.

In at least one exemplary embodiment, referring to FIGS. 1-11, the first electrically connecting regions 103 and the second electrically connecting regions 104 are positioned at opposite sides of the receiving channel 107.

In another exemplary embodiment, referring to FIG. 12, the first electrically connecting regions 103 and the second electrically connecting regions 104 are positioned at one side of the receiving channel 107.

A loudspeaker with the printed circuit board 10 is also disclosed.

Figure 17:
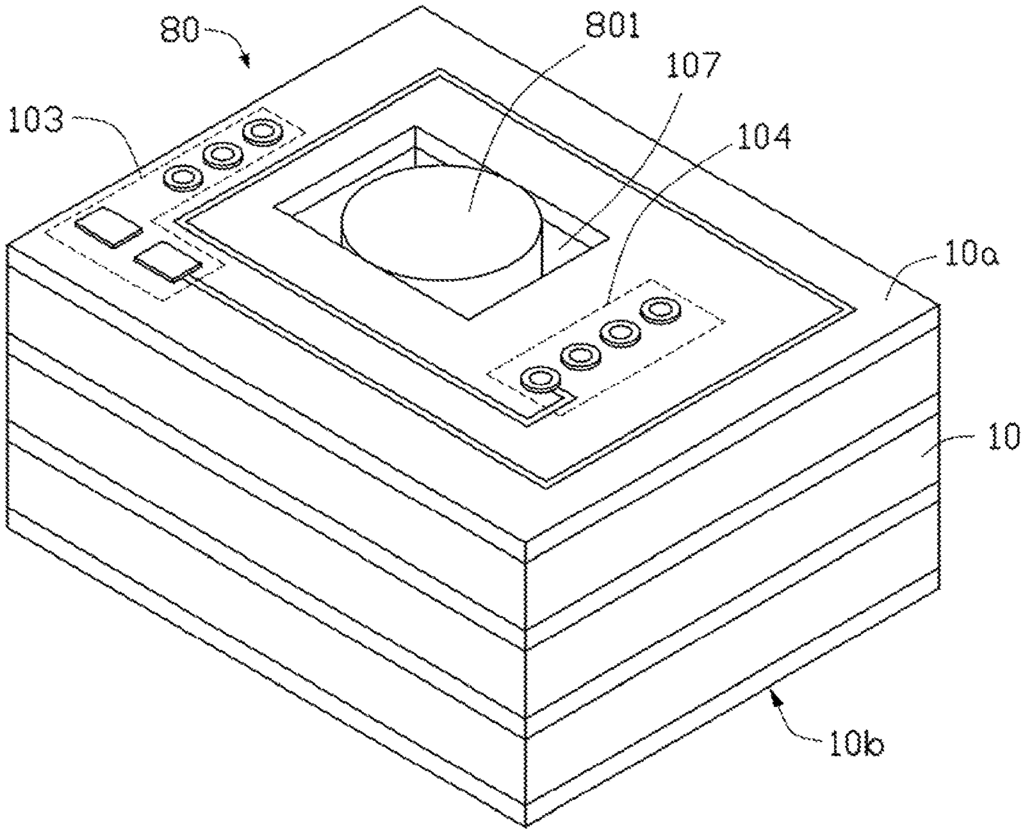
FIG. 17 is an isometric view of a loudspeaker with the printed circuit board of FIG. 1 in accordance with an embodiment of the present disclosure.

Referring to FIG. 17, FIG. 17 is an isometric view of a loudspeaker 80 with the printed circuit board 10 in accordance with an exemplary embodiment of the present disclosure.

The printed circuit board 10 has a receiving channel 107 formed through the top surface 10*a* and the bottom surface 10*b* of the printed circuit board 10.

Each first circuit structure 201 starts in the first electrically connecting region 103, spirals around and closes to the second electrically connecting region 104 and the receiving channel 107, and ends in the second electrically connecting region 104. Each second circuit structure 202 starts in the second electrically connecting region 104, spirals around and away from the second electrically connecting region 104 and the receiving channel 107, and ends in the first electrically connecting region 103.

The loudspeaker 80 also comprises a magnetic core 801 received in the receiving channel 107 of the printed circuit board 10. The magnetic core 801 is used for providing a first magnetic field. The printed circuit board 10 is surrounded by the first magnetic field. When the printed circuit board 10 is powered, electrical current spirals around the second electrically connecting regions 104 and the receiving channel 107 along a clockwise direction or a counterclockwise direction for generating a second magnetic field. An acting force is generated between the first magnetic field and the second magnetic field, and a displacement is generated between the magnetic core 801 and the printed circuit board 10 for driving other components of the loudspeaker 80 to make a sound.

Figure 18:
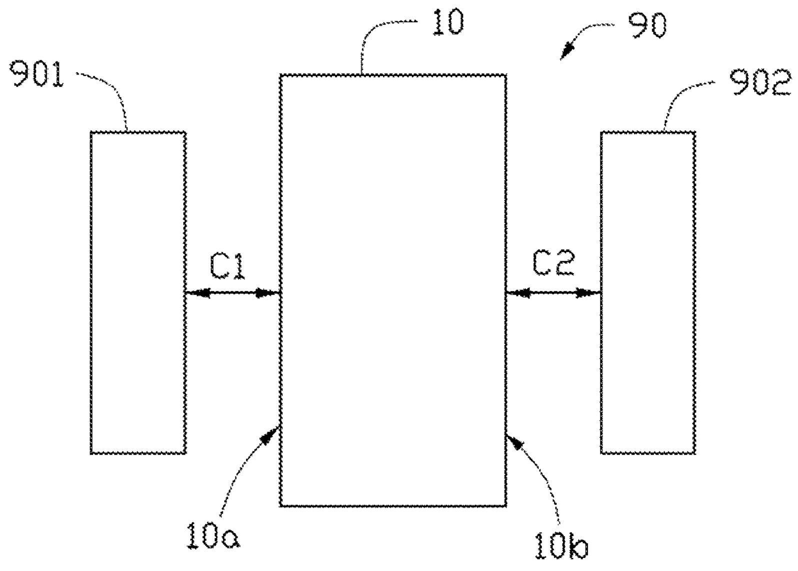
FIG. 18 is an isometric view of a loudspeaker with the printed circuit board of FIG. 1 in accordance with a second exemplary embodiment of the present disclosure.

Referring to FIG. 18, FIG. 18 is an isometric view of a loudspeaker 90 with the printed circuit board 10 in accordance with an exemplary embodiment of the present disclosure.

The printed circuit board 10 of the loudspeaker 90 does not have the receiving channel 107.

The loudspeaker 90 comprises a first magnet 901 and a second magnet 902. The printed circuit board 10 is positioned between the first magnet 901 and the second magnet 902. The first magnet 901 faces the top surface 10*a* of the printed circuit board 10, and the second magnet 902 faces the bottom surface 10*b* of the printed circuit board 10. A first distance C1 is between the first magnet 901 and the top surface 10*a* of the printed circuit board 10. A second distance C2 is between the second magnet 902 and the bottom surface 10*b* of the printed circuit board 10. The first distance C1 may or may not be equal to second distance C2. The first magnet 901 and the second magnet 902 are used for providing a first magnetic field. The printed circuit board 10 is around in the first magnetic field. When the printed circuit board 10 is powered, electrical current spirals around the second electrically connecting regions 104 along a clockwise direction or a counterclockwise direction for generating a second magnetic field. An acting force is generated between the first magnetic field and the second magnetic field, and the printed circuit board 10 moves between the first magnet 901 and the second magnet 902 for driving other component of the loudspeaker 90 to make a sound.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A printed circuit board used as a voice coil comprising N board units stacked over one another, where N≥1, the printed circuit board having a top surface and a bottom surface opposite to the top surface, each board unit having a first electrically connecting region and a second electrically connecting region, all of the first electrically connecting regions being stacked over one another, all of the second electrically connecting regions being stacked over one another, each board unit having a first circuit structure, a base, and a second circuit structure arranged from top to bottom, in each two adjacent board units, the first electrically connecting region of the second circuit structure of an upper board unit being electrically connected in series with the first electrically connecting region of the first circuit structure of a lower board unit, in each board unit, the first circuit structure being electrically connected in series with the second circuit structure in the second electrically connecting region, each first circuit structure starting in the first electrically connecting region, spiraling around and closes to the second electrically connecting region, and ending in the second electrically connecting region, each second circuit structure starting in the second electrically connecting region, spiraling around and away from the second electrically connecting region, and ending in the first electrically connecting region, each first circuit structure and second circuit structure spiraling around the second electrically connecting region along a clockwise direction or a counterclockwise direction, starting points in the first electrically connecting regions of the first circuit structures of the board units being staggered, and starting points in the second electrically connecting regions of the second circuit structures of the board units being staggered, ending points in the second electrically connecting regions of the first circuit structures of the board units being staggered, and ending points in the first electrically connecting regions of the second circuit structures of the board units being staggered.

2. The printed circuit board of claim 1, wherein the first electrically connecting region of the first circuit structure of the board unit has a starting terminal positioned at one starting point, and the first electrically connecting region of the second circuit structure of the Nth board unit has an ending terminal positioned at one ending point.

3. The printed circuit board of claim 1, wherein a plurality of holes are defined through the top surface and the bottom surface of the printed circuit board, each hole receives an electrically connecting portion.

4. The printed circuit board of claim 3, wherein a number of the board units is N, a number of the plurality of holes is 2N−1.

5. The printed circuit board of claim 4, wherein N−1 of the plurality of holes are positioned in the first electrically connecting regions, N of the plurality of holes are positioned in the second electrically connecting regions.

6. The printed circuit board of claim 1 further comprises a receiving channel formed through the top surface and the bottom surface of the printed circuit board.

7. The printed circuit board of claim 1, wherein the first circuit structure starts in the first electrically connecting region, spirals around and closes to the second electrically connecting region and the receiving channel, and ends in the second electrically connecting region, the second circuit structure starts in the second electrically connecting region, spirals around and away from the second electrically connecting region and the receiving channel, and ends in the first electrically connecting region.

8. The printed circuit board of claim 1, wherein the first electrically connecting regions and the second electrically connecting regions are positioned on opposite sides of the receiving channel or on one side of the receiving channel.

9. A method for manufacture a print circuit board used as a voice coil comprises:

providing N board units, where N≥1, each board unit having a first electrically connecting region and a second electrically connecting region, each board unit having a first circuit structure, a base, and a second circuit structure arranged from top to bottom, each first circuit structure starting in the first electrically connecting region, spiraling around and closing to the second electrically connecting region, and ending in the first electrically connecting region, each second circuit structure starting in the second electrically connecting region, spiraling around and away from the second electrically connecting region, and ending in the first electrically connecting region;

stacking the N board units, the first electrically connecting regions being stacked over one another, and the second electrically connecting regions being stacked over one another;

starting points in the first electrically connecting regions of the first circuit structures of the board units being staggered, and starting points in the second electrically connecting regions of the second circuit structures of the board units being staggered, ending points in the second electrically connecting regions of the first circuit structures of the board units being staggered, and ending points in the first electrically connecting regions of the second circuit structures of the board units being staggered; and in each board unit, electrically connecting in series the first circuit structure and the second circuit structure in the second electrically connecting region, in each two adjacent board units, electrically connecting in series the first electrically connecting region of the second circuit structure of an upper board unit and the first electrically connecting region of the first circuit structure of a lower board unit.

10. The method of the claim 9, wherein a plurality of adhering layers is disposed between each two adjacent board units.

11. The method of the claim 9, wherein the first electrically connecting region of the first circuit structure of the board unit has a starting terminal positioned at one starting point, and the first electrically connecting region of the second circuit structure of the Nth board unit has an ending terminal positioned at one ending point.

12. The method of the claim 9, wherein in the "in each board unit, electrically connecting in series the first circuit structure and the second circuit structure in the second electrically connecting region, in each two adjacent board units, electrically connecting in series the first electrically connecting region of the second circuit structure of an upper board unit and the first electrically connecting region of the first circuit structure of a lower board unit", a plurality of holes are defined through the top surface and the bottom surface of the printed circuit board, each hole receives an electrically connecting portion.

13. The method of the claim 9 further comprises forming a receiving channel through the top surface and bottom surface of the printed circuit board.

14. The method of the claim 13, wherein the first circuit structure starts in the first electrically connecting region, spirals around and closes to the second electrically connecting region and the receiving channel, and ends in the second electrically connecting region, the second circuit structure starts in the second electrically connecting region, spirals around and away from the second electrically connecting region and the receiving channel, and ends in the first electrically connecting region.

15. The method of the claim 14, wherein the first electrically connecting regions and the second electrically connecting regions are positioned on opposite sides of the receiving channel or on one side of the receiving channel.

16. A loudspeaker comprises a printed circuit board used as a voice coil, the printed circuit board comprising N board units stacked over one another, where N≥1, the printed circuit board having a top surface and a bottom surface opposite to the top surface, each board unit having a first electrically connecting region and a second electrically connecting region, all of the first electrically connecting regions being stacked over one another, all of the second electrically connecting regions being stacked over one another, each board unit having a first circuit structure, a base, and a second circuit structure arranged from top to bottom, in each two adjacent board units, the first electrically connecting region of the second circuit structure of an upper board unit being electrically connected in series with the first electrically connecting region of the first circuit structure of a lower board unit, in each board unit, the first circuit structure being electrically connected in series with the second circuit structure in the second electrically connecting region, each first circuit structure starting in the first electrically connecting region, spiraling around and closes to the second electrically connecting region, and ending in the second electrically connecting region, each second circuit structure starting in the second electrically connecting region, spiraling around and away from the second electrically connecting region, and ending in the first electrically connecting region, each first circuit structure and second circuit structure spiraling around the second electrically connecting region along a clockwise direction or a counter-clockwise direction, starting points in the first electrically connecting regions of the first circuit structures of the board units being staggered, and starting points in the second electrically connecting regions of the second circuit structures of the board units being staggered, ending points in the second electrically connecting regions of the first circuit structures of the board units being staggered, and ending points in the first electrically connecting regions of the second circuit structures of the board units being staggered.

17. The loudspeaker of claim 16, wherein a plurality of holes are defined through the top surface and the bottom surface of the printed circuit board, each of the plurality of holes receives an electrically connecting portion.

18. The loudspeaker of claim 17, wherein a number of the board units is N, a number of the plurality of holes is 2N−1.

19. The loudspeaker of claim 16 further comprises a first magnet and a second magnet, the printed circuit board is positioned between the first magnet and the second magnet, the first magnet faces the top surface of the printed circuit board, and the second magnet faces the bottom surface of the printed circuit board.

20. The loudspeaker of claim 16, wherein a receiving channel formed through the top surface and the bottom surface of the printed circuit board, each first circuit structure starts in the first electrically connecting region, spirals around and closes to the second electrically connecting region and the receiving channel, and ends in the second electrically connecting region, each second circuit structure starts in the second electrically connecting region, spirals around and away from the second electrically connecting region and the receiving channel, and ends in the first electrically connecting region, and the speak further comprises a magnetic core received in the receiving channel of the printed circuit board.

* * * * *